United States Patent
Zhang et al.

(10) Patent No.: US 7,852,692 B2
(45) Date of Patent: Dec. 14, 2010

(54) MEMORY OPERATION TESTING

(75) Inventors: Shayan Zhang, Austin, TX (US); Jack M. Higman, Austin, TX (US); Michael D. Snyder, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 123 days.

(21) Appl. No.: 12/164,755

(22) Filed: Jun. 30, 2008

(65) Prior Publication Data

US 2009/0323446 A1    Dec. 31, 2009

(51) Int. Cl.
  *G11C 29/00* (2006.01)
(52) U.S. Cl. .................. 365/201; 365/200; 365/226; 365/227; 365/205; 365/207; 365/189.11; 365/189.12
(58) Field of Classification Search .............. 365/201, 365/200, 226, 227, 205, 207, 189.11, 189.12
See application file for complete search history.

(56) References Cited

U.S. PATENT DOCUMENTS

| | | | | |
|---|---|---|---|---|
| 5,428,574 A | * | 6/1995 | Kuo et al. ............... | 365/201 |
| 6,067,263 A | * | 5/2000 | Brady ..................... | 365/201 |
| 6,259,640 B1 | * | 7/2001 | Endo et al. ............... | 365/201 |
| 6,483,156 B1 | | 11/2002 | Adkisson et al. | |
| 6,862,233 B2 | * | 3/2005 | Laurent .................. | 365/201 |
| 7,193,901 B2 | | 3/2007 | Ruby et al. | |
| 2007/0152734 A1 | | 7/2007 | Senthinathan et al. | |
| 2007/0220388 A1 | | 9/2007 | Quereshi et al. | |

OTHER PUBLICATIONS

Wang, et al., Canary Replica Feedback for Near-DRV Standby Vdd Scaling in a 90 nm SRAM, IEEE, 2007 Custom Integrated Circuits Conference (CICC).

* cited by examiner

*Primary Examiner*—Van Thu Nguyen
*Assistant Examiner*—Douglas King
(74) *Attorney, Agent, or Firm*—David G. Dolezal; James L. Clingan, Jr.

(57) ABSTRACT

Test circuitry for determining whether a memory can operate at a lower operating voltage. The test circuitry includes a sense circuit having a delayed sensing characteristic as compared to other sense amplifier circuits of the memory. With this circuitry, the test circuitry can determine if the sense circuit can provide valid data under more severe sensing conditions. In one example, the sense circuit includes a delay circuit in the sense enable signal path. If sense circuit can provide data at more server operating conditions, then the memory operating voltage can be lowered.

20 Claims, 7 Drawing Sheets

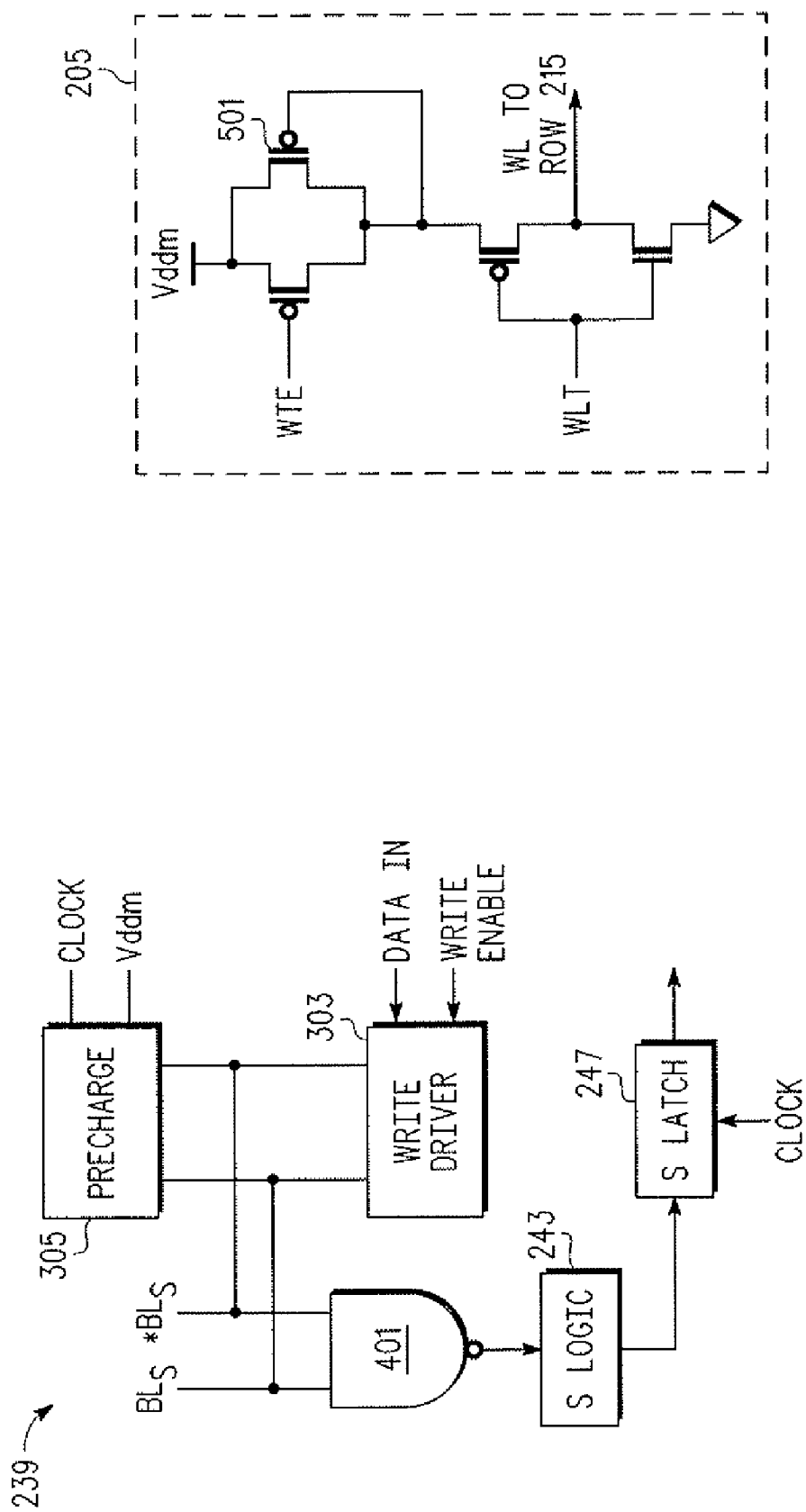

MEMORY OPERATION TESTING

BACKGROUND OF THE INVENTION

1. Field of the Invention

This invention relates in general to memories and more specifically to testing memory operation.

2. Description of the Related Art

Memories operate differently at different voltages. For example, some memories operate faster at higher voltages. However, operating at higher voltages may increase power consumption. Accordingly, it may be desirable to operate at a voltage that is just high enough for effective operation.

Memories may also operate differently at different localities in a multi-core chip under the same voltage. For example, due to global and local variations across a large multi-core chip, a local memory dedicated to a particular core may run slower than other memories of other cores with the same voltage. This may limit the peak performance of a system due to a single slower local memory. Therefore, it is also desirable to operate to achieve a target frequency that is just high enough for system performance.

What is desired is a system for testing and configuring memory operation at different parameters for optimal memory system operation.

BRIEF DESCRIPTION OF THE DRAWINGS

The present invention may be better understood, and its numerous objects, features, and advantages made apparent to those skilled in the art by referencing the accompanying drawings.

FIG. 4 is a more detailed diagram of some of the circuitry of FIG. 2 according to another embodiment of the present invention.

FIG. 5 is a more detailed diagram of some of the circuitry of FIG. 2 according to another embodiment of the present invention.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
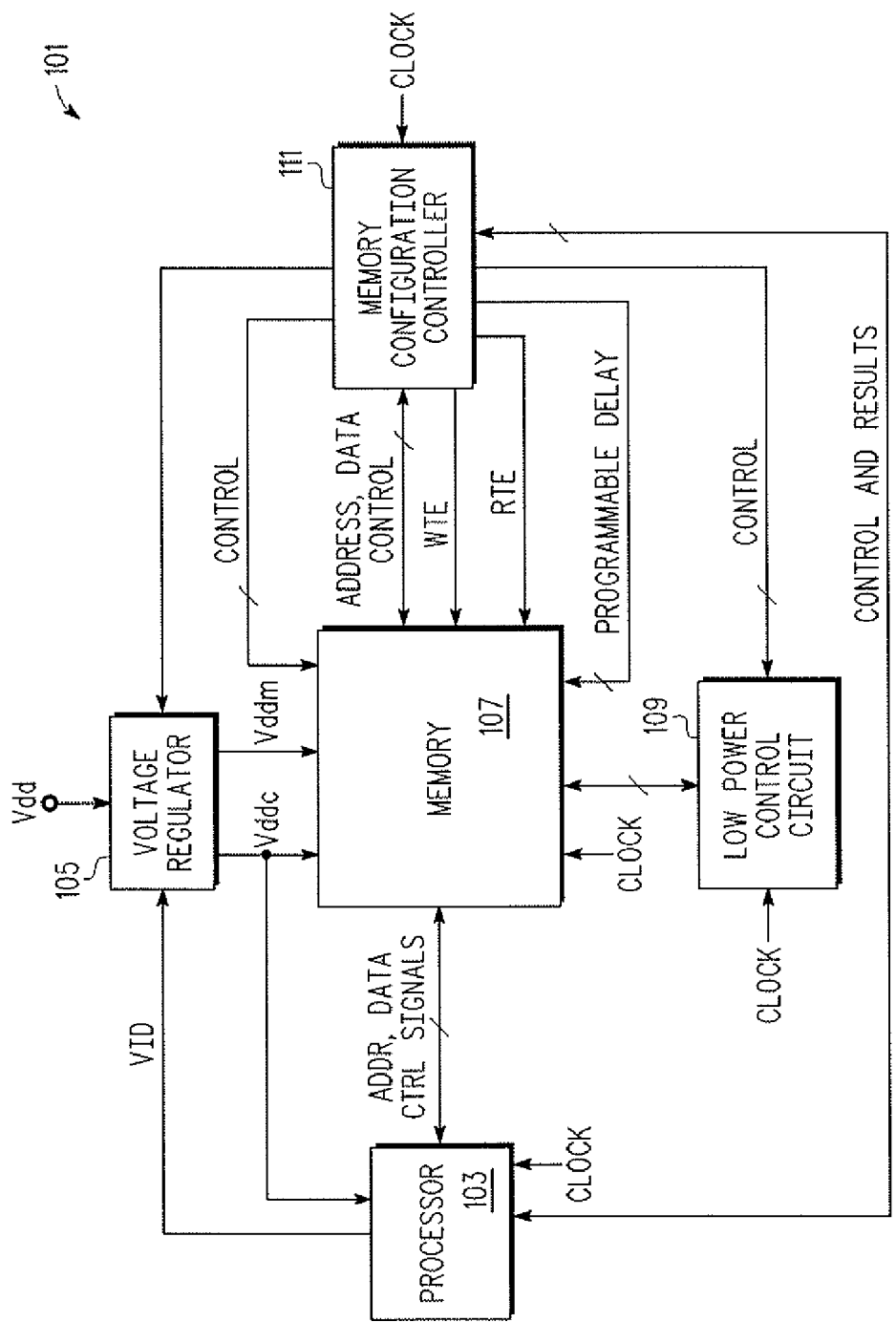
FIG. 1 is a block diagram of a data processing system according to one embodiment of the present invention.

FIG. 1 is a block diagram of a data processing system 101. Data processing system 101 includes circuitry for dynamically adjusting an operating voltage (Vddm) for powering a memory 107 and testing to determine if the memory can operate effectively at different voltages. System 101 includes circuitry that writes data to cells of memory 107 and reads that data to determine whether the memory will operate effectively at those voltages.

Figure 8:
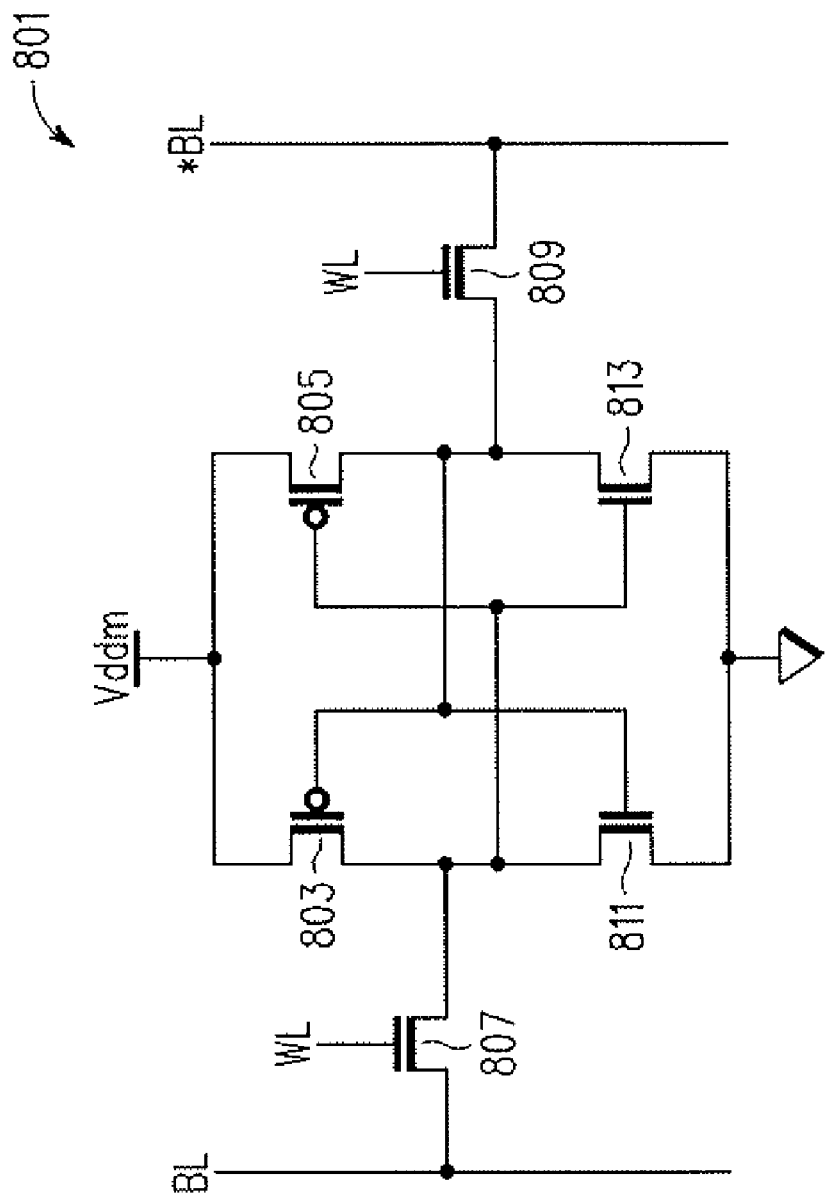
FIG. 8 is a circuit diagram of a memory cell.

System 101 includes a processor 103 operably coupled via address, data, and control signal lines to memory 107 for conveying data to be written to and read from memory 107. In one embodiment, memory 107 includes an array of memory cells for storing the data. In one embodiment, memory 107 includes SRAM cells, but may include other types of cells such as DRAM, MRAM, Flash, or ROM cells. In one embodiment, the cells are 6T SRAM cells. See for example, FIG. 8 showing cell 801. However, in other embodiments, a memory cell may include a different number of transistors per cell in other embodiments. Referring back to FIG. 1, system 101 includes a voltage regulator for converting an input voltage at Vdd to voltages Vddc and Vddm to be supplied to various circuits of system 101.

System 101 includes a memory configuration controller 111 that is operably coupled to memory 107 via the address, data, and control signals as well as by various other control signals for performing operations to adjust the voltage of Vddm and test memory 107 to determine whether it can properly operate at different values of Vddm.

System 101 includes a low power control circuit 109. Low power control circuit 109 enables word line early kill to cut bit line separation power. It also enables bit body biasing of bit cells in some embodiments. In some embodiments, these low power features may be selectively enabled based upon a determination of whether memory 107 is capable of operating a lower operating voltage or at a greater clock frequency as determined by the testing below.

In one embodiment, the circuitry shown in FIG. 1 is implemented on a single integrated circuit. However, in other embodiments, the circuitry may be implemented with multiple integrated circuits. In other embodiment, system 101 may have other configurations. For example, system 101 may include other processors that are operably coupled to memory 107 and/or may contain multiple memories similar to memory 107. Also, in some embodiments, the operations of controller 111 may be performed by processor 103.

Figure 2:
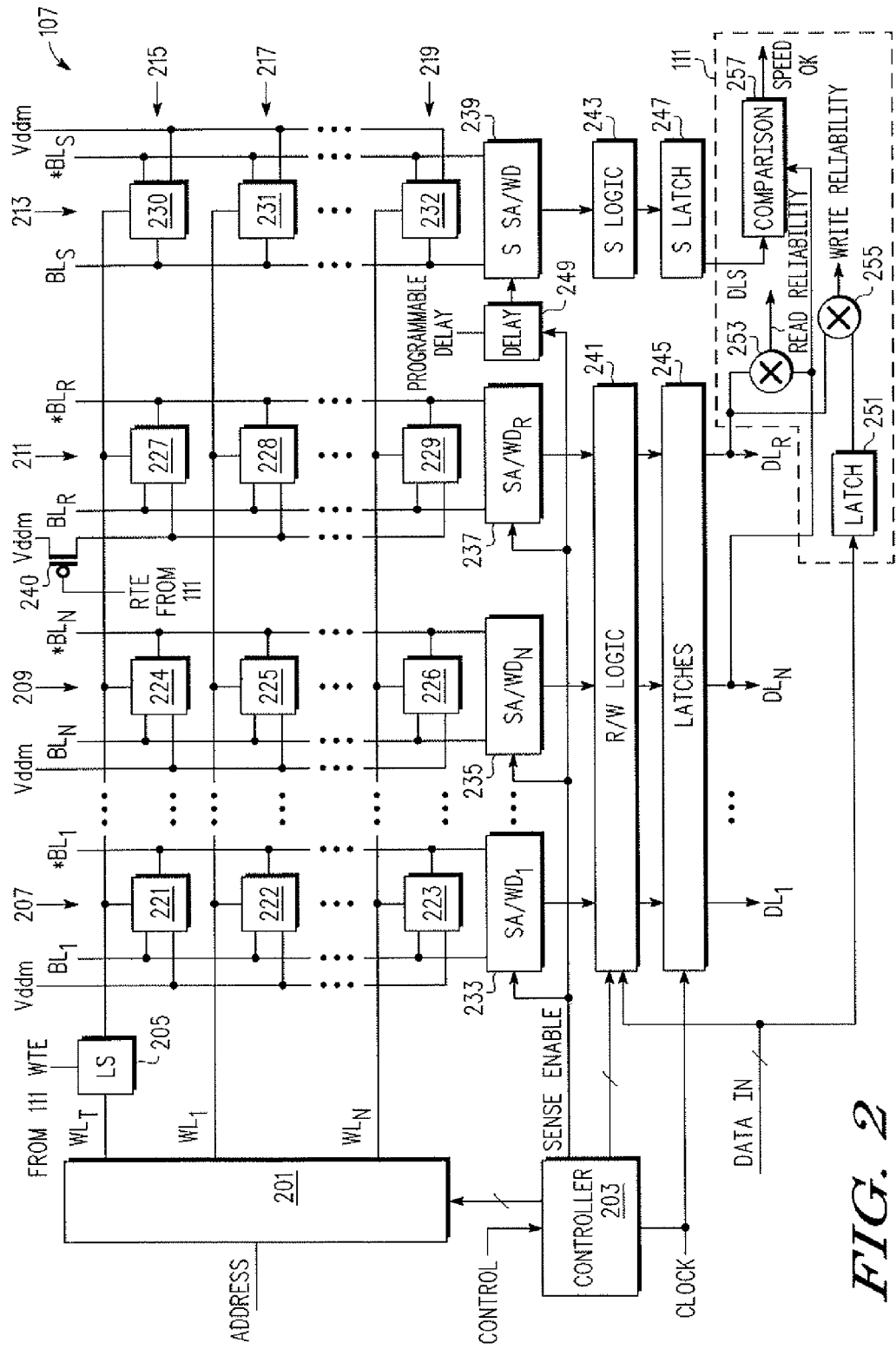
FIG. 2 is block diagram of a memory according to one embodiment of the present invention.

FIG. 2 is a more detailed block diagram of memory 107 and portions of controller 111. Memory 107 includes a word line driver 201, controller 203, latches 245, read/write logic 241, and an array of memory cells (221-232) that are arranged in columns 207, 209, 211, and 213 and arranged in rows 215, 217, and 219. Each column of bit cells is coupled to a sense array/write driver circuit (233, 235, 237, and 239). In one embodiment, each sense array/write driver circuit includes a precharge circuit for precharging the bit lines (BL and *BL) of each column. Each of circuits 233, 235, and 237 is coupled to provide data of its respective column to logic 241. In one embodiment, logic 241 may include multiplexers and column redundancy logic (not shown). The output of logic 241 is provided to latches 245 whose latched output provides data on a data bus to processor 103. In other embodiments, the memory may include a greater number of cells, rows, and columns. In one embodiment, the circuitry of memory 107, including the circuitry of circuits 233, 235, 237, and 239 word line driver 201, controller 203 logic 241, and latches 245 are powered at voltage Vddm. However, in other embodiments, some of this circuitry may be powered at other voltages.

The sense amplifiers of each SA/WD circuit are activated by the assertion of a sense enable signal provided by controller 203. To read a cell of memory 107, word line driver 201 asserts the word line of the particular row of the cells to be read as indicated by the address and the sense enable signal is asserted to activate the sense amplifiers of the SA/WD circuits to provide the output of the sense amplifiers of the selected columns (in some embodiments) to the latches 245. The input of the latches 245 are latched at their output at a clock edge to provide the data on a data line.

To write to the cells of memory 107, the data to be written is provided to logic 241 where the write drivers of the SA/WD circuits are set to drive the bit lines of the columns to a write voltage level while the word line of the row to be written is asserted. Other memories in other embodiments may work in other ways and/or have other types of circuitry.

Controller 111 and memory 107 include circuitry for determining whether the memory can properly operate at various voltages other than Vddm while Vddm is being supplied to certain cells of the array. The determination of whether the memory operates properly at a different voltage is made by determining whether test cells of the memory provide valid data under conditions different than other cells being used by the array for storing data. Memory 107 includes a write test row 215, a read test column 211, and a speed margin read test column 213 for testing memory performance.

System 101 includes circuitry for write testing memory 107 at voltages that are less than the operating voltage being provided to memory 107. In the embodiment shown, the cells in row 215 are capable of being written to with a word line voltage that is less than the word line voltages applied to cells used for storing data of system 101 (cells 222, 223, 225, and 226 in FIG. 2). This reduction in voltage is selectively achieved during a write operation, in the embodiment shown, by level shifting the voltage of word line WLT down by a predetermined voltage. In one embodiment, the predetermined amount is a PMOS threshold voltage drop (e.g. 0.2 Volts).

To see if a write to cells of row 215 was correctly made at the reduced word line voltage, the value of cell 227 is read and is XORed by XOR gate 255 with the value written to that cell, as stored in latch 251, to determine if the write was successful. During the read of cell 227, voltage Vddm is provided to cell 227 and its word line. Any differences in the read values would indicate that memory 107 can not be properly written at the lower voltage. If the values match, it indicates that memory 107 can be properly written to at the lower voltage. By performing these at speed operations, data can be write tested in memory 107 at a voltage that is less than what is provided to the other word lines. In another embodiment, all of the data written to row 215 is compared with the data written to those cells to determine whether data can be written to memory 107 at lower voltages. Accordingly, a write test can be performed to determine if the cells of memory 107 can be written to at a lower voltage than what the memory is currently being powered with. In other embodiments, other types of circuitry and/or other methods may be utilized to write test memory 107.

System 101 also includes circuitry for read testing memory 107 at voltages that are less than the operating voltage being provided to memory 107. Memory 107 includes a read test column 211 whose cells can be biased at a voltage that is less than the operating voltage Vddm provided to the rest of the cells of memory 107. In the embodiment of FIG. 8, the reduced voltage would be applied to the current terminals of transistors 803 and 805 instead of Vddm for the cells of column 211. In the embodiment of FIG. 2, the voltage used to power the cells of column 211 is controlled by PFET 240 whose gate is controlled by the read test enable (RTE) signal from 111. The other cells of memory 107 are powered at Vddm. In the embodiment shown, the RTE signal is an analog signal that is used to control the voltage drop across transistor 240 to reduce from Vddm, the operating voltage supplied to cells 277, 278, and 279 of column 211 during a read of those cells. In one embodiment of a read test, the cells of column 211 are written with the same values written to another column (e.g. column 209). During the writing of these cells, Vddm is provided to both columns of cells. The voltage provided to the cells of column 211 is then reduced and then the values (or at least one value) stored in column 211 are read (in multiple read operations) and compared by XOR gate 253 with the values from the cells of column 209. The values of the cells of column 209 are powered at Vddm during the read operation. Any differences in read values would indicate that memory 107 can not be properly be read at the lower voltage. If the values match, it indicates that memory 107 can be properly read at the lower voltage. In other embodiments, memory 107 may be read tested at lower than operating voltages in other ways and/or with other types of circuitry.

Memory 107 also includes circuitry for providing memory reads of some cells of memory 107 with sense circuitry having a delayed sensing characteristic that is different than sense circuitry for reading other cells of memory 107. This delayed sensing characteristic provides memory 107 with the ability to perform speed margin tests on some cells while other cells are being used during operation. Providing a delayed sensing characteristic, allows speed margins tests to be performed where some cells of memory 107 are read at speed margin sensing conditions that are more severe than the conditions under which other cells are read (e.g. at the same time in some embodiments). If the cells of column 213 can be read under these more severe conditions, then it provides an indication that operating parameters of memory 107 (e.g. voltage or frequency) of memory 107 can be adjusted (e.g. to operate at a lower voltage or a faster frequency).

In one embodiment for providing a sense circuit with a delayed sensing characteristic, memory 107 includes a delay circuit 249 for delaying the assertion of the sense enable signal to the sense amplifier of S SA/WD circuit 239. Delaying the assertion of the sense amplifier signal to circuit 239 provides less time for that sense amplifier to operate to read the data in column 213. The data from circuitry 239 is provided through S logic 243 to S latch 247. The output of S latch 247 is compared by comparison circuitry (e.g. an XOR gate) with data from another column in which the same data was written. Whether the data matches or not indicates whether memory 107 can operate under more severe sensing conditions. In some embodiments, only one cell of column 213 would be read, but in other embodiments, other cells of the column may be read during a speed margin test over multiple operations. In one embodiments, data of cells 222, 223, 225, and 226 may be read during the speed margin operations. Utilizing the speed margin sensing circuitry shown in FIG. 2 allows for some cells of memory 107 to be read at more severe sensing characteristics while other cells are read under known sensing characteristics and/or are operable for storing data and reading data.

In one embodiment, delay 249 is programmable. However in other embodiments, the amount of delay is fixed. In the embodiment shown, delay is programmed by the programmable delay signal from circuitry (not shown) of controller 111. In other embodiment, delay 249 is programmed by the delay signal from other circuitry (e.g. processor 103).

In one embodiment, the delay can be programmable at increments of 25-30 picoseconds. In one embodiment, delay element 249 may include a number of chained inverters (e.g. 2-N) which can be programmed by enabling a particular number of inverters with the programmable delay signal. In one embodiment, memory 107 may include multiple sense circuits distributed throughout the array of memory 107. Each of these sense circuits may share delay 249 for providing a delay in the assertion of the sense enable signal.

In one embodiment, circuit 111 can be configured to test the cells at a varying number of delays of delay 249 to determine the shortest delay value that causes a read failure of a cell of column 213. From that delay value, a minimum operating voltage can be determined at which memory 107 will operate properly. Also, in some embodiment, from the minimum delay, a maximum clock frequency that memory 107 could operate for a given Vddm voltage may be determined based on the maximum permitted delay that provides valid data. In one embodiment, controller 111 would include tables for storing operating frequency and operating voltages associated with the measured delays. In the embodiment shown, these operations can be determined while other cells of memory 107 are written and read under normal operating characteristics.

In other embodiments, speed margin testing can be performed by other circuitry and in other ways. For example, the output of S Latch 247 can be compared with a latched value of data (e.g. from latch 251) written to a cell to determine with whether a read provides valid data under the more severe conditions.

Providing a sense amplifier with a delayed sensing characteristic enables speed margin testing to be performed, in some embodiments, without the use of counters, shift registers, or a ring oscillator frequency monitor for measuring speed margin. Accordingly speed margin testing can be performed with circuitry that is less complex and takes up less integrated circuit space than with circuitry that includes counters or shift registers. Also, the use of counters or shift registers may require the use of clocks faster than the system clock for memory operation. Further more, using ring oscillator as a "speed scale rule" to measure memory read speed "relatively" may not provide a true indication of the real read speed margin as described in this application. This makes speed margin prediction inaccurate and the minimum margin setting difficult for the control of changing operating parameters as described in this application.

In other embodiments, memory 107 may have multiple write test rows (similar to row 215), multiple read test columns (similar to column 211), and multiple speed sensing columns (similar to column 213) for providing test data. These test rows and columns may be located at various locations in the memory array of memory 107. Also in other embodiments, multiple values can be read from each test row or column to determine whether memory 107 could be written to or read from under conditions that are "more severe" than what other portions of memory 107 are operating under. Also in other embodiments, the speed margin tests and the read tests may be implemented in the same column, where the programmed delay of delay element 249 would be zero during the read test and transistor 240 would be programmed to provide no voltage drop during the speed margin test. However, with separate columns, these tests may be performed at the same time in some embodiments.

Figure 3:
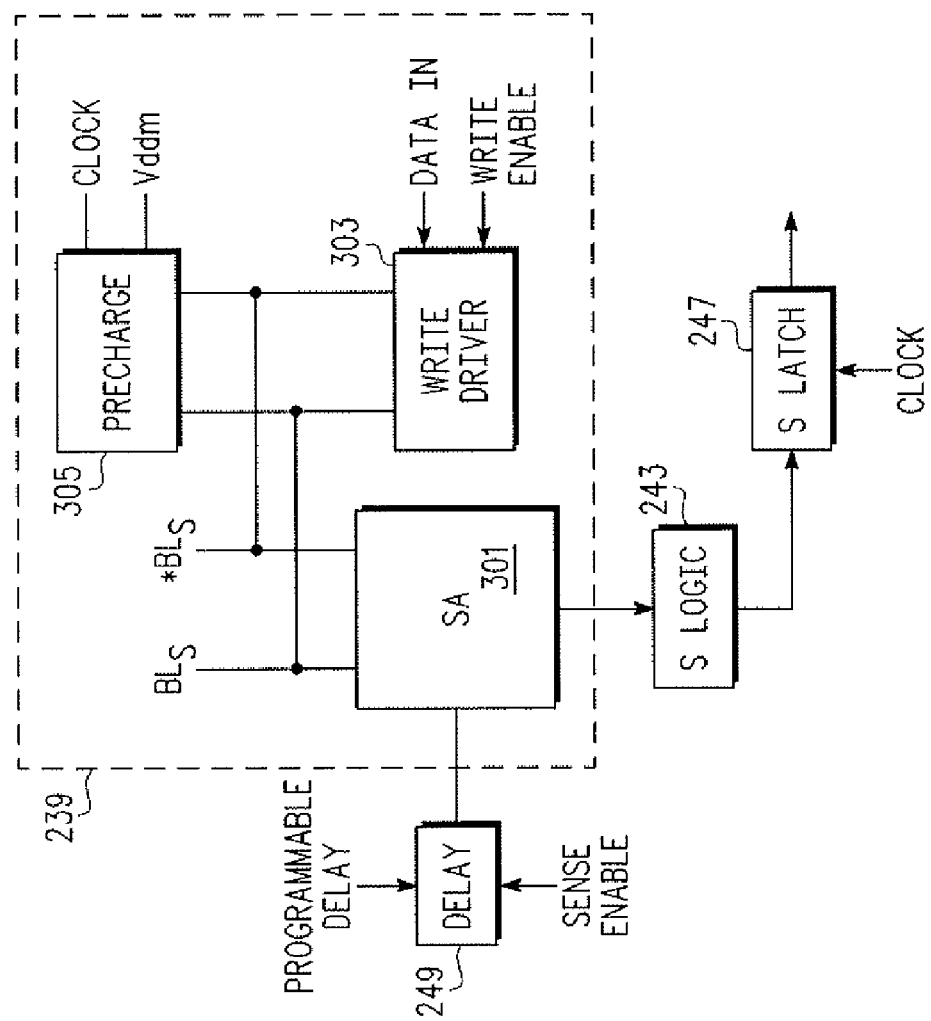
FIG. 3 is a more detailed block diagram of some of the circuitry of FIG. 2 according to one embodiment of the present invention.

FIG. 3 is a more detailed embodiment of S SA/WD circuit 239. In the embodiment of FIG. 3, circuit 239 includes a sense amplifier 301, a write driver 303, and a precharge circuit 305. Precharge circuit 305 precharges the bit lines BLS and *BLS prior to a read of a cell coupled to these bit lines. Write driver 303 biases bit lines BLS and *BLS for writes to cells coupled to these bit lines based on the data in line. The output of sense amplifier 301 is provided to S logic 243. The output of S logic 243 is provided to S latch 247 which latches the value on a clock edge.

FIG. 4 shows an alternative embodiment of circuitry for providing a sense circuit with a delayed sensing characteristic. In the embodiment shown, a NAND gate 401 is used in place of a sense amplifier 301 in circuit 239. A NAND gate is typically slower than a sense amplifier in providing a determinative value based on droops in voltage of each of the complementary bit lines. For a NAND gate, the logical high voltage value is not provided at its output until one of the bit lines passes below a voltage threshold defined by device P/N ratio of the NAND gate during a read.

In one embodiment, if valid data from a cell (or cells) of column 213 can be provided with the use of a NAND gate, then memory 107 is considered to be operable at a lower operating voltage or a higher clock frequency. If valid data can not be provided, then memory 107 is not considered operable at those different operating characteristics.

FIG. 5 is a circuit diagram of level shifter 205. In the embodiment shown, level shifter 205 provides word line WTE with a threshold voltage drop. The drop is provided by the voltage drop across PFET 501. However, in other embodiments, a voltage drop may be provided by other circuits in other embodiments. In some embodiments, the voltage drop may be programmable to provide granularity in testing. For example, level shifter may include a transistor similar to transistor 240 in FIG. 2 to provide the voltage drop for WLT. In one embodiment, the transistor would be controlled by the RTE signal so that the same voltage drop would be generated for both word line WLT and the operating voltage provided to the cells of column 211.

Figure 6:
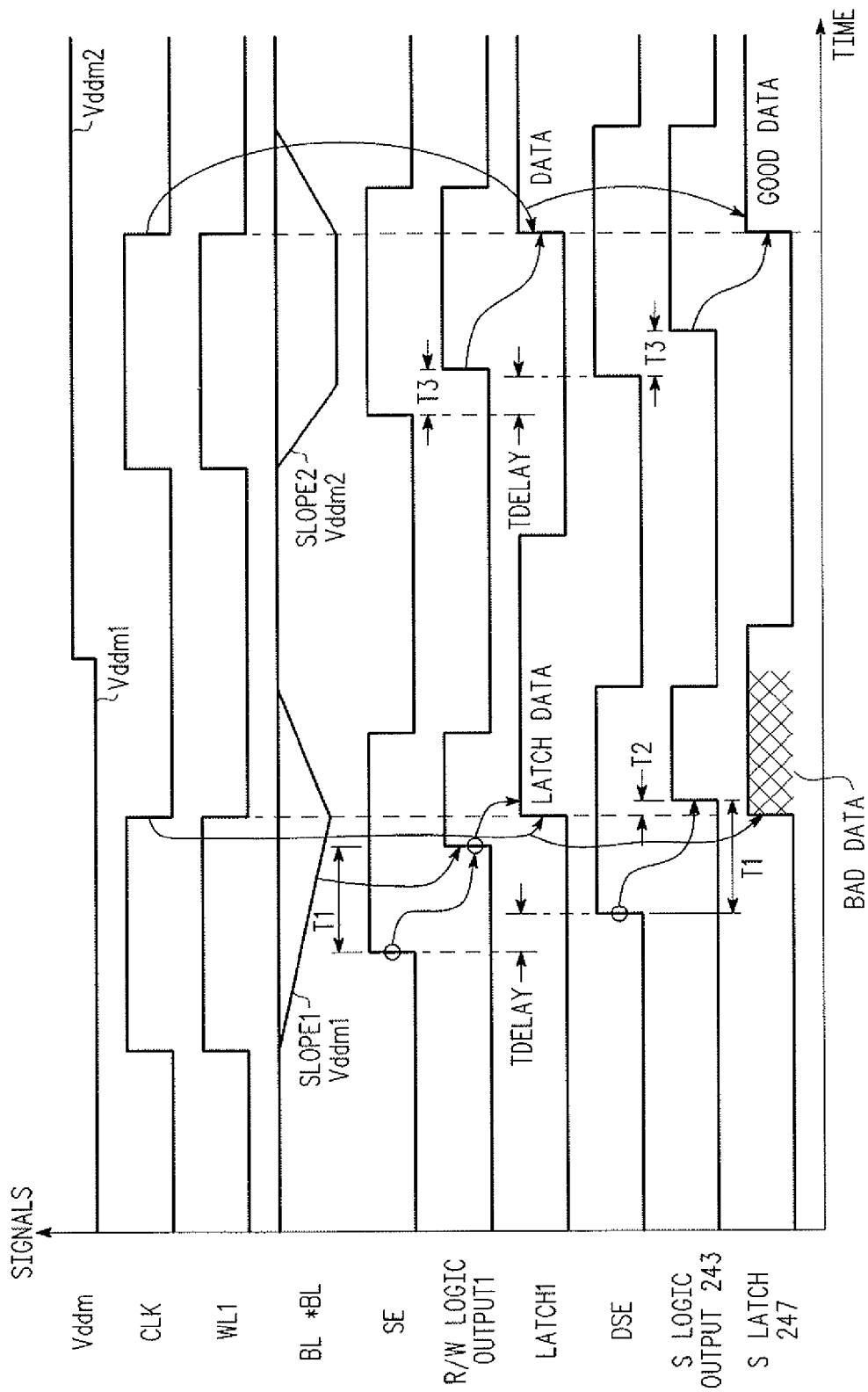
FIG. 6 is a timing diagram according to one embodiment of the present invention.

FIG. 6 is a timing diagram showing one embodiment of how read circuitry with a delayed sensing characteristic can be used to determine whether a memory can operate under more severe sensing characteristics.

In the embodiment of FIG. 6, two reads are performed. The first read is performed when Vddm is at a first value Vddm1 and a second read is performed when Vddm is at a second value Vddm2 which is a higher voltage than Vddm1. FIG. 6 shows a read of cells on two types of columns, one type is a column coupled to a sense circuit with no delayed sensing characteristic (e.g. columns 207 and 209). The other type is a column coupled to a sense circuit with a delayed sensing characteristic (e.g. column 213) In FIG. 6, bit lines BL and *BL represent the bit lines of both types of columns during both reads.

The output of the first type of column (no delayed sensing characteristic) is shown by the R/W logic output1 and latch1 signals. This read is initiated by the assertion of a signal on word line (WL1) at a rising clock edge, which causes the activation of the sense enable signal at a time period later, indicated by a rising edge of signal SE. The assertion a signal on the word line pulls one of the complementary bit lines of the column towards ground while the other remains at the precharge voltage. Which of the bit lines of the complementary bit line pair that is pulled to ground depends upon whether a one or zero is stored in the memory cell being read. The assertion of the sense enable signal activates the sense amplifier to produce a read value at logic output 1 based on the value being read. On the next falling clock edge, the logic output 1 value is latched on latch 1. Because, a read value appears on logic output1 before the failing clock edge, a valid data value is latched. With the deassertion of the word line signal, the bit lines are precharged and the sense enable signal is deasserted.

In the embodiment shown, the time that the sense enable signal SE is asserted (asserted high in the embodiment shown) until a read value appears at logic output 1 is designated as time period T1. This time period represents how fast it takes a sense amplifier to determine the value provided on the bit lines and for that value to be provided at output1 of the R/W logic. This T1 time period normally has a strong dependence on Vddm and a weak dependence on the timing of SE's rising edge when the separation of BL and *BL is larger than a predetermined minimum value.

As can be shown in FIG. 6, a delayed sense enable signal (DSE) is asserted at a later time than the SE signal (the difference in time being designated as Tdelay). As shown in FIG. 6, the time needed for the output of S logic output 241 to be valid from the assertion of the DSE signal is roughly equal to T1. (The weak dependence of T1 on the timing of SE's rising edge is of a secondary effect and is thus ignored in FIG. 6). Because the assertion of the DSE signal is delayed by time period Tdelay, the output of S logic 243 is not valid until after the falling edge of the clock signal (the time difference indicated by time period T2). Accordingly, S latch 247 does not latch a valid value and the speed margin test fails.

In the embodiment shown, the slope of bit line decay (slope 1) is dependent upon the value of voltage Vddm. In one embodiment, the gate of a pull down transistor pair (e.g. 807/811 and 809/813 in FIG. 8) of a bit cell is biased at Vddm.

The higher the bias voltage, the larger the cell circuit and so the faster the bit line is pulled to ground. The faster the bit line is pulled to ground, the faster the complimentary bit lines diverge in voltage and the faster a sense amplifier can operate to provide a valid signal from the assertion of the sense enable signal (the shorter period T1 is). Also, the sense amplifier and logic circuits of a memory operate faster at a higher Vddm. This may also contribute to a reduction in time T1.

A second read is shown where Vddm is raised to a higher voltage Vddm2. At this higher voltage, the slope of decay (slope2) of the bit line during a read is greater, thereby allowing a sense amplifier to operate faster to provide a valid value form the assertion of the sense enable signal (shown as time period T3 in FIG. 6). Also, the logic circuitry and sense amplifier circuitry operate faster at a higher operating voltage. Accordingly, time T3 is shorter than time T1 in FIG. 6.

Because time T3 is shorter at the higher voltage, the output of S logic 243 provides valid data prior to the falling edge of the clock signal. Therefore, valid data is latched by S latch 247. This indicates that the speed margin is good and that the memory can operate at a lower voltage or at a higher frequency.

Figure 7:
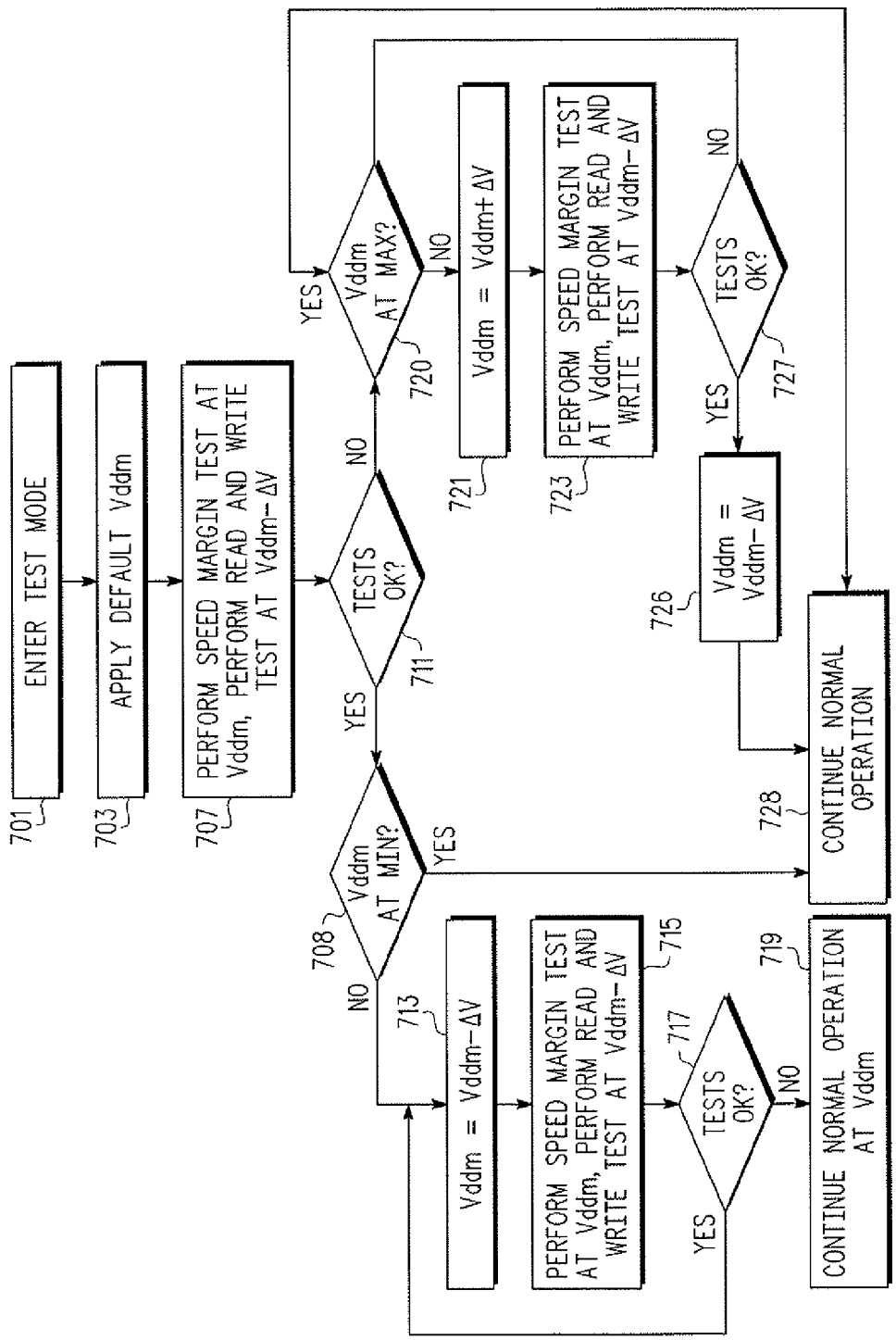
FIG. 7 is a flow chart according to one embodiment of the present invention.

FIG. 7 represent one embodiment of how the speed margin test circuitry, the write test circuitry, and the read test circuitry can be used to adjust the operating voltage of memory 107. In one embodiment, the initiation of these operations in controlled by controller 111. However, theses operations maybe controlled by other circuitry (e.g. processor 103) in other embodiments.

In operation 701 a test mode is entered. The test mode may be entered in response to a request to change the operating clock frequency of memory 107 or change the operating voltage Vddm of memory 107, e.g. in response to a change in operating modes. In other embodiments, the test mode may be entered in response to a detected change in temperature. In other embodiments, a memory may continuously operate in the test mode where memory 107 is continuously tested for adjusting the operating voltage. In some embodiment, testing can be performed a the same time with normal memory operations. For example, during the test mode of FIG. 7, the non test cells of memory 107 (cells 222, 223, 225, and 227) are operable to be read from and written to e.g. by processor 103.

In operation 703, voltage regulator 105 provides a default operating voltage value for Vddm. The default value is provided to the non test cells for normal operation.

In operation 707, a speed margin test is performed by reading a value from a cell or cells of column 213 at Vddm. Also in operation 707, a read test of a cell or cells of column 211 is performed and a write test of a cell or cells of row 215 is performed to determine whether memory is operable at voltage less than Vddm. In one embodiment of operation 707, signal RTE is set such that a voltage of (Vddm−ΔV) is provided to the cells of column 211 during a read. During a write test, a voltage of (Vddm−ΔV) is provided on word line WLT to the cells of row 215 during a write.

If the speed margin test, the read test, and the write test all pass in decision 711, this indicates that memory 107 can operate at a lower operating voltage. In one embodiment, if one of the tests does not pass as determined in decision 711, then the remaining tests are not performed.

If Vddm is at the minimum voltage as determined in decision 708, no more tests are performed and memory 107 continues to operate at Vddm in operation 728. If in decision 708, Vddm is not at a minimum value, Vddm is set to Vddm−ΔV in operation 713 wherein memory 107 operates at that voltage.

In operation 715, a speed margin test, a read test, and a write test are performed similar to the tests performed in operation 707. However, because Vddm was lowered in operation 713, the read tests and the write test are performed at lower voltages (by decrement steps of ΔV) from those performed in operation 707.

If all tests pass as determined by decision 717, then that means that memory 107 is capable at operating at the lower operating voltage of Vddm−ΔV.

Accordingly, Vddm is set to Vddm−ΔV in operation 713 and the tests of operation 715 are rerun with even lower voltages to see if memory 107 is operable at those lower voltages.

Operations 713 and 715 are rerun until a voltage value of Vddm−ΔV is found in which memory 107 will not operate (fails one of the speed margin, write, and read tests of operation 715). This is the highest voltage at which memory 107 will not operate properly. When that voltage level is found, the test mode is complete where memory 107 continues to operate at the Vddm value that was set in the last iteration of operation 713.

In the embodiment of FIG. 7, controller 111 tests for an operating voltage that is lower than the operating voltage that is currently applied to the memory. If the test circuitry indicates that the memory can operate at the lower voltage, then operating voltage is lowered to the lower voltage. The memory is tested again for an even lower operating voltage until a voltage is found in which it will not work. Because memory 107 includes circuitry for testing at lower voltages or at reduced margins, these tests can be performed during normal memory operations (e.g. when data is being stored, written to or read from in non test cells) without risking the data stored in those cells or preventing the proper operation being performed on those cells.

In one embodiment, the value of ΔV is point 0.2V. However, in other embodiments, the value of ΔV may be of other values e.g. in the range of 0.05-0.5 volts depending upon the capability of the test circuitry and specifications of voltage regulator 105.

In one embodiment, in response to finding the highest voltage that memory 107 will not operate, Vddm may be raised to a value that is at least one ΔV above the highest operating voltage that does not work. In some embodiments, Vddm is raised by two increments of ΔV from the highest voltage that memory 107 will not operate. For example, if ΔV is 0.1V and a highest operating voltage that failed tests of operation 715 in FIG. 7 is 0.7V, Vddm will be raised to 0.9V for a guard band margin of one unit of ΔV.

The embodiment of FIG. 7 can be used to set the operating voltage of a memory at a level that is higher than the default voltage.

If the tests of operation 707 are determined not to pass in decision 711, then that means that the voltage of Vddm−ΔV is not a voltage at which memory 107 can operate. If Vddm is at the maximum value as determined in decision 720, then the voltage can not be raise, and the memory continues operation at the default value of Vddm. In some embodiments, a failure indicated at decision 711 would generate an error to processor 103.

If Vddm is not at a maximum value, then at operation 721, Vddm is set to Vddm+ΔV. At operation 723, speed margin tests of column 213 are performed at Vddm (the previous Vddm+ΔV) and read and write testing of the test row 215 and column 211 are performed with the voltages at Vddm−ΔV (the default value for Vddm). If all tests pass in decision 727, that indicates that Vddm−ΔV is the lowest voltage that memory 107 can operate. Accordingly in operation 726, the operating voltage is set to Vddm−ΔV and normal operation continues in 727. In some embodiment, the operating voltage would not be set to Vddm−ΔV in operation 726 but instead would remain at Vddm to provide the operating voltage with a safe operating margin.

If in decision 727, all tests did not pass, then operations 721 and 723 are repeated until the lowest value for Vddm can be found where memory 107 will operate in operation 723. Once that value is found, then in operation 726 Vddm is set to that value. In this embodiment, the highest voltage at which memory 107 will not work is the voltage tested for in the previous iteration of operation 723. The operations on the right hand side of FIG. 7 can terminate at the first voltage found that works in that the previous iteration found lower voltages that did not work.

In some embodiments, operation 726 would not performed. In these embodiments, Vddm would remain at Vddm for normal operation in operation 728. With these embodiments, the operating voltage would have an extra ΔV voltage margin. Still in other embodiments, Vddm may be incremented by an additional amount (e.g. ΔV, 2 ΔV) prior to operations 719 and 728 to provide an additional voltage margin.

Other embodiments may include other methods for finding the lowest operating voltage at which memory 107 can operate. For example, in FIG. 7, the default voltage can be set at the maximum voltage, wherein only the left side of operations of FIG. 7 are needed to incrementally drop Vddm down to find the highest voltage that memory 107 will not work. In embodiments where other cells are storing data for normal operation, it may be desirable to start at the highest value of Vddm and incrementally lower Vddm down to find the highest voltage that memory 107 will not operate. With such embodiments, the operating voltage of Vddm is never below a voltage where memory 107 will not operate.

However, in other embodiments, the default Vddm can be the lowest operating voltage wherein only the operations of the right side of FIG. 7 are performed to incrementally raise Vddm.

In other embodiments, the voltages may be raised or lowered at non incremental values to determine the lowest operating voltage at which memory 107 will operate properly. In still other embodiments, ΔV may be variable during the tests.

In other embodiments, the test circuitry can perform tests for different voltages to find the lowest operating voltage without raising or lowering Vddm during the process. In these embodiments, the voltage drop by level shifter 205 is programmable to shift the voltage of word line WLT by a variable amount. Thus, the test cells of memory 107 can be tested at a number of voltages without adjusting Vddm.

In one such embodiment, speed margin tests on a cell or cells of column 213 would be performed where the delay for each test would be increased until a delay is found where the speed margin test fails. Controller 111 would correlate the delay of the last successful test with a value of Vddm ("tested voltage value") at which memory 107 could operate. A read test would be performed where the RTE signal is set to bias the cells of column 211 at the tested voltage value to determine if a cell or cells could be read at that voltage. A write test could be performed by lowering the shifted word line voltage WLT to the tested voltage value to determine if a cell or cells of row 215 could be written to at the lower voltage. If the read and write tests are successful, then Vddm would be lowered to the tested voltage value. If not, then the tested voltage value may be incrementally raise to find a value for which both the read and write tests pass. Once that voltage value is found, then the Vddm is lowered to that voltage value.

One advantage that may occur with at least some embodiments described herein is that non test cells of memory 107 are still operable to store user data while the test cells are being tested at lower voltages and more severe sensing conditions. Accordingly, optimal operating voltages can be determined during operation. For example, reading an writing to the non test cells can be performed during the reads and writes to the test cells. This is especially advantageous where a system is capable of transitioning to different operating modes (e.g. at different clock frequencies or different power modes) during operation or where a system operates at different temperature extremes. Optimal memory operating voltages can be determined during operations in response to such changes.

Also in other embodiments, other circuits may include voltage reduction circuits (e.g. like level shifter 205 and transistor 240) that can reduce the voltage to other parts of memory 107 for testing test cells as at lower voltages than Vddm. For example, precharge circuit 305 may include a PFET similar to PFET 240 that reduces the voltage that the bits lines are precharged to. In other embodiments, precharge circuit 305 may include a non programmable voltage reduction circuit similar to level shifter 205.

In some embodiments, only some of the tests are performed with the test circuitry to determine if memory 107 can operate at a lower voltage. For example, only the speed margin test may be performed in one embodiment, but a different test or combination of tests may be performed in other embodiments.

In other embodiments, a memory may include multiple test columns, test rows, and other testing circuitry similar to that shown in FIG. 2 at different locations of a memory. In some embodiments, a failure of a test at any location of the memory for a test voltage would mean that the memory could not operate at that test voltage. In some embodiments, operating voltages to each region of a memory could be adjusted based on the results generated by the test circuitry of that region.

One embodiment includes a method for operating a memory. The memory includes an array of memory cells. The method includes providing a first operating voltage to a first portion of the memory. The first portion includes a first set of memory cells of the array. The memory includes a first plurality of sense amplifier circuits coupled to the first set of memory cells. The method includes testing a second set of memory cells of the array of the memory to determine if the second set can operate at a lower operating voltage than the first operating voltage. The memory includes a diagnostic sense circuit coupled to at least some of the second set of cells. The diagnostic sense circuit has a delayed sensing characteristic as compared to the first plurality of sense amplifier circuits. The testing is performed while the operating voltage is provided to the first portion of the memory and the first set of memory cells are operable to store data. The testing further includes using the diagnostic sense circuit to sense data from at least one cell of the second set of cells. The testing includes reading a stored value of the at least one cell and determining if valid data is read.

In another embodiment, a circuit includes an array of memory cells and a first plurality of sense circuits coupled to a first set of memory cells of the array. Each of the first plurality of sense circuits including a sense amplifier for reading a data value of a cell of the first set coupled to the sense circuit during a read operation. Each of the first plurality of sense circuits including an output for providing an indication of a data value of a cell of the first set coupled to sense circuit during a read operation as determined by the sense amplifier of the sense circuit. The circuit includes a diagnostic sense circuit coupled to a second set of memory cells of the array. The diagnostic sense circuit including an output for providing an indication of a data value of a cell of the second set coupled to diagnostic sense circuit during a read operation. The diagnostic sense circuit is characterized as having a delayed sensing characteristic with respect to the sense circuits of the first plurality of sense circuits in providing a data value of a cell during a read operation.

In another embodiment, a method includes asserting a sense enable signal on a sense enable line and providing the asserted sense enable signal to a first plurality of sense amplifiers of a memory. Each of the first plurality of sense amplifiers is coupled to a column of memory cells of a plurality of memory cells of an array. The method includes delaying the asserted sense enable signal so as to provide the asserted sense enable signal to a second sense amplifier after the providing the asserted sense enable signal to the first plurality of sense amplifiers. The method includes providing an output signal of the second sense amplifier to an input of a latch circuit, the output signal of the second sense amplifier provided in response to the asserted sense enable signal being provided to the second sense amplifier. The method includes latching at an output of the latch circuit a value of an input of the latch circuit at a clock edge and determining whether the input of the latch circuit received valid data from the output signal prior to the latching by comparing the output of the latch circuit to a second value.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for operating a memory wherein the memory includes an array of memory cells, the method comprising:
providing a first operating voltage to a first portion of the memory, the first portion including a first set of memory cells of the array, wherein the memory includes a first plurality of sense amplifier circuits coupled to the first set of memory cells;
testing a second set of memory cells of the array of the memory to determine if the second set can operate at a lower operating voltage than the first operating voltage, wherein the memory includes a diagnostic sense circuit coupled to at least some of the second set of cells, the diagnostic sense circuit having a delayed sensing characteristic as compared to the first plurality of sense amplifier circuits;
wherein the testing is performed while the operating voltage is provided to the first portion of the memory and the first set of memory cells are operable to store data, the testing further includes using the diagnostic sense circuit to sense data from at least one cell of the second set of cells, wherein the testing includes reading a stored value of the at least one cell and determining if valid data is read.

2. The method of claim 1, wherein the reading a stored value of the at least one cell and determining if valid data is read further includes determining whether an accurate representation of a logic state of the at least one cell read by the diagnostic sense circuit is provided to a latch input at a predetermined time relative to a first clock edge.

3. The method of claim 1, wherein the testing further includes performing a write verification test on at least one of the second set of memory cells with a write voltage is applied to the at least one cell from a word line during a write, wherein the write voltage is less than a second write voltage applied to memory cells of the first set by a second word line.

4. The method of claim 1, wherein the testing further comprising:
performing a read verification test on at least one cell of the second set of cells, wherein the read verification test includes powering the at least one cell at a test voltage while powering cells of the first set at the operating voltage, wherein test voltage is less than the operating voltage.

5. The method of claim 1 further comprising:
if the testing determines that the second set can operate at the lower operating voltage than the first operating voltage, changing the first operating voltage provided to the first portion of the memory to the lower operating voltage.

6. The method of claim 1, wherein the diagnostic sense circuit having a delayed sensing characteristic compared to the first plurality of sense amplifier circuits is further characterized as the diagnostic sense circuit having a delay circuit that delays an assertion of a sense enable signal to a sense amplifier of the diagnostic sense circuit as compared to the assertion of a sense enable signal being provided to a sense amplifier of the first plurality of sense amplifier circuits.

7. The method of claim 1 further comprising:
if the testing determines that the second set can not operate at the lower operating voltage than the first operating voltage, changing the first operating voltage provided to the first portion of the memory to a higher operating voltage.

8. The method of claim 3 further comprising:
outputting an asserted word line signal on the word line by a word line driver for writing to the at least one of the second set of memory cells;
reducing a voltage of the asserted word line signal prior to the asserted word line signal being provided to the at least one of the second set of memory cells.

9. The method of claim 5 further comprising:
if the testing determines that the second set can operate at the lower operating voltage than the first operating voltage, testing for a second time, the second set of cells of the array of the memory to determine if the second set can operate at a second lower operating voltage, wherein the second lower operating voltage is lower than the lower operating voltage;
if the second testing determines that the second set can operate at the second lower operating voltage, changing the lower operating voltage provided to the first portion of the memory to the second lower operating voltage.

10. A circuit, comprising:
an array of memory cells;
a first plurality of sense circuits coupled to a first set of memory cells of the array, each of the first plurality of sense circuits including a sense amplifier for reading a data value of a cell of the first set coupled to the sense circuit during a read operation, each of the first plurality of sense circuits including an output for providing an indication of a data value of a cell of the first set coupled to sense circuit during a read operation as determined by the sense amplifier of the sense circuit;
a diagnostic sense circuit coupled to a second set of memory cells of the array, the diagnostic sense circuit including an output for providing an indication of a data value of a cell of the second set coupled to diagnostic sense circuit during a read operation, wherein the diagnostic sense circuit is characterized as having a delayed sensing characteristic with respect to the sense circuits of the first plurality of sense circuits in providing a data value of a cell during a read operation.

11. The circuit of claim 10 wherein:
each of the first plurality of sense circuits includes an input to receive a sense enable signal for activating the sense amplifier of the sense circuit during a read;
the diagnostic sense circuit includes an input to receive the sense enable signal,
the delayed sensing characteristic is characterized in that the diagnostic sense circuit includes a delay element in a path between the input and the sense amplifier of the diagnostic sense circuit such that time period for activation of the sense amplifier of the diagnostic sense circuit from the assertion of the sense enable signal is greater than the time period for activation of the sense amplifier of the first plurality of sense circuits from the assertion of the sense enable signal.

12. The circuit of claim 10 wherein:
each of the first plurality of sense amplifiers is coupled to at least one bit line for receiving an indication of a value of a cell during a read operation of the cell;
the diagnostic sense circuit includes a logic gate couple to the at least one bit line for receiving an indication of a value of a cell during a read operation of a cell, wherein the delayed sensing characteristic of the diagnostic sense circuit is characterized as the logic gate being configured to provide a data value of cell during a read operation at a later time than the sense amplifiers of the first plurality of sense circuits.

13. The circuit of claim 10 further comprising:
a determination circuit operably coupled to the diagnostic sense circuit to determine whether the sense diagnostic circuit provides valid data during a read operation.

14. The circuit of claim 10 wherein:
the array includes a first column of cells and a plurality of columns of cells, wherein each cell of first column and each cell of the plurality of columns of cells include a bias input for receiving an operating voltage for powering the cell;
the circuit further comprises:
  a voltage regulator having an output for providing operating power to each bias input;
  a voltage reduction device coupled between the output of the voltage regulator and the bias inputs of the cells of the first column to selectively reduce the voltage at the bias input of the cells of the first column with respect to the voltage at the inputs of the cells of the plurality of columns.

15. The circuit of claim 10 wherein:
the array includes a first row of cells and a plurality of rows of cells, wherein each cell of first row is coupled to a first word line, and each cell of each row of the plurality of rows is coupled to a word line of a first plurality of word lines associated with that row;
a word line driver including a first output coupled to the first word line, the word line driver including a first plurality of outputs, each output of the first plurality of outputs coupled to a word line of the first plurality;
a word line voltage reduction device coupled between the first output of the word line driver and the first row of cells for reducing the voltage on the first word line when a word line signal is asserted with respect to the voltages on the plurality of word lines when word line signals are asserted.

16. The circuit of claim 11, wherein the delay element is programmable.

17. The circuit of claim 13 further comprising:
controlling circuitry coupled to the determination circuit for adjusting an operating voltage being supplied to a memory array, wherein the controlling circuitry lowers the operating voltage in response to a determination that the memory can operate at a lower operating voltage, wherein the determination that the memory can operate at a lower operating voltage is based on the determination circuit determining that the diagnostic sense circuit provides valid data during a read operation.

18. The circuit of claim 13 further comprising:
a latch circuit having a first input coupled to receive data from the diagnostic sense circuit, a second input coupled to receive a clock signal, and an output coupled to the determination circuit;
wherein the determination circuit determines whether the diagnostic sense circuit provides valid data by comparing the output of the latch circuit to a value written to the cell being read.

19. The circuit of claim 13 further comprising:
a latch circuit having a first input coupled to receive data from the sense diagnostic circuit, a second input coupled to receive a clock signal, and an output coupled to the determination circuit;
wherein the diagnostic sense circuit provides valid data during a read operation if the first input of a latch circuit receives data from the diagnostic sense signal prior to a clock edge received at the second input, wherein the latch circuit is configures to latch at its output a logic value of its first input at the clock edge.

20. A method, comprising:
asserting a sense enable signal on a sense enable line;
providing the asserted sense enable signal to a first plurality of sense amplifiers of a memory, each of the first plurality of sense amplifiers is coupled to a column of memory cells of a plurality of memory cells of an array;
delaying the asserted sense enable signal so as to provide the asserted sense enable signal to a second sense amplifier after the providing the asserted sense enable signal to the first plurality of sense amplifiers;
providing an output signal of the second sense amplifier to an input of a latch circuit, the output signal of the second sense amplifier provided in response to the asserted sense enable signal being provided to the second sense amplifier;
latching at an output of the latch circuit a value of the input of the latch circuit at a clock edge;
determining whether the input of the latch circuit received valid data from the output signal prior to the latching by comparing the output of the latch circuit to a second value.

* * * * *